(12) United States Patent
Song et al.

(10) Patent No.: US 11,309,428 B2
(45) Date of Patent: Apr. 19, 2022

(54) TRANSISTOR AND MANUFACTURING METHOD THEREOF, DISPLAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Ce Zhao, Beijing (CN); Yuankui Ding, Beijing (CN); Ming Wang, Beijing (CN); Jun Liu, Beijing (CN); Yingbin Hu, Beijing (CN); Wei Li, Beijing (CN); Liusong Ni, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 16/706,160

(22) Filed: Dec. 6, 2019

(65) Prior Publication Data
US 2020/0273995 A1 Aug. 27, 2020

(30) Foreign Application Priority Data
Feb. 26, 2019 (CN) .......................... 201910142849.5

(51) Int. Cl.
*H01L 29/78* (2006.01)
*H01L 29/786* (2006.01)
(Continued)

(52) U.S. Cl.
CPC ...... *H01L 29/7869* (2013.01); *H01L 27/1225* (2013.01); *H01L 29/78696* (2013.01); *H01L 27/3262* (2013.01)

(58) Field of Classification Search
CPC ............. H01L 29/7869; H01L 27/1225; H01L 29/78696; H01L 27/3262
(Continued)

(56) References Cited

U.S. PATENT DOCUMENTS

2013/0207087 A1* 8/2013 Kim .................. H01L 29/78633
257/40
2015/0171113 A1* 6/2015 Honjo ............... H01L 29/78603
257/72

(Continued)

FOREIGN PATENT DOCUMENTS

| CN | 108258021 A | 7/2018 |
| CN | 109300990 A | 2/2019 |

(Continued)

OTHER PUBLICATIONS

First Office Action dated Sep. 1, 2021 for application No. CN201910142849.5 with English translation attached.

*Primary Examiner* — Didarul A Mazumder
(74) *Attorney, Agent, or Firm* — Nath, Goldberg & Meyer; Joshua B. Goldberg

(57) ABSTRACT

The present disclosure provides a transistor and a manufacturing method thereof, a display substrate and a display device. The transistor includes: a base structure; an active layer on the base structure; and a gate electrode, a source electrode and a drain electrode that are all located on a side of the active layer distal to the base structure. The active layer includes a first region corresponding to an orthographic projection of the gate electrode on the base structure and a second region outside the orthographic projection. A surface of the base structure in contact with the active layer (Continued)

in the first region is not in the same plane as a surface of the base structure in contact with the active layer in the second region. The active layer in the first region has substantially the same thickness as a thickness of the active layer in the second region.

7 Claims, 5 Drawing Sheets

(51) Int. Cl.
*H01L 27/12* (2006.01)
*H01L 27/32* (2006.01)

(58) Field of Classification Search
USPC .................. 257/66; 438/149, 151, 157, 166
See application file for complete search history.

(56) References Cited

U.S. PATENT DOCUMENTS

| | | | |
|---|---|---|---|
| 2017/0092779 A1* | 3/2017 | Kimura | ............. H01L 29/42384 |
| 2018/0069132 A1* | 3/2018 | Lim | .................. H01L 29/66969 |

FOREIGN PATENT DOCUMENTS

| | | | |
|---|---|---|---|
| EP | 0377084 A1 * | 10/1989 | |
| EP | 0377084 A1 | 7/1990 | |
| KR | 20070040128 A | 4/2007 | |

* cited by examiner

TRANSISTOR AND MANUFACTURING METHOD THEREOF, DISPLAY SUBSTRATE AND DISPLAY DEVICE

CROSS-REFERENCE TO RELATED APPLICATIONS

This application claims priority from the patent application No. 201910142849.5 filed with the China Patent Office on Feb. 26, 2019, the entire contents of which is incorporated herein by reference.

TECHNICAL FIELD

The present disclosure relates to the field of display technology, and particularly relates to a transistor and a manufacturing method thereof, a display substrate and a display device.

BACKGROUND

Current AMOLED products are developing towards higher definition, larger size and higher refresh frequency, which places higher demands on Thin Film Transistors (TFTs) of AMOLED drive circuits. Since a Top Gate (Top Gate) oxide semiconductor transistor has an effectively reduced parasitic capacitance, a better refresh frequency, a shorter channel as well as a smaller size, the Top Gate (Top Gate) oxide semiconductor transistors can meet the development requirements of the AMOLED better. As a result, the Top Gate oxide semiconductor transistor has become a key direction for future research and development.

SUMMARY

In one aspect, there is provided a transistor, including: a base structure; an active layer on the base structure; and a gate electrode, a source electrode and a drain electrode that are all on a side of the active layer distal to the base structure. The active layer includes a first region corresponding to an orthographic projection of the gate electrode on the base structure and a second region outside the orthographic projection. The active layer in the second region contains a conductorized semiconductor material. A surface of the base structure in contact with the active layer in the first region is not in the same plane as a surface of the base structure in contact with the active layer in the second region. The active layer in the first region has substantially the same thickness as a thickness of the active layer in the second region.

In one embodiment, the base structure includes one or more sub-film layers, wherein at least one sub-film layer of the one or more sub-film layers in the first region has a greater thickness than a thickness of the at least one sub-film layer in the second region.

In one embodiment, the base structure includes one or more sub-film layers, wherein at least one sub-film layer of the one or more sub-film layers is located only in the first region.

In one embodiment, the base structure includes a buffer layer, a light shielding layer, and a substrate arranged sequentially in a direction from the active layer to the substrate. The light shielding layer in the first region has a greater thickness than a thickness of the light shielding layer in the second region.

In one embodiment, the light shielding layer includes a light shielding metal material.

In one embodiment, the base structure includes a buffer layer, a light shielding layer, and a substrate arranged sequentially in a direction from the active layer to the substrate. The buffer layer in the first region has a greater thickness than a thickness of the buffer layer in the second region.

In one embodiment, the base structure includes a buffer layer, a light shielding layer, and a substrate arranged sequentially in a direction from the active layer to the substrate. The substrate in the first region has a greater thickness than a thickness of the substrate in the second region.

In one embodiment, the base structure includes only a substrate, and the substrate in the first region has a greater thickness than a thickness of the substrate in the second region.

In one embodiment, the substrate includes a glass material.

In one embodiment, the transistor further includes: a first insulating layer between the gate electrode and the active layer; and a second insulating layer between the source electrode, drain electrode and the gate electrode. The source electrode and the drain electrode are on a side of the gate electrode distal to the active layer. The source electrode and the drain electrode are in the same layer.

In one embodiment, the active layer includes an oxide semiconductor material.

In one aspect, there is provided a display substrate including the transistor as described above.

In one aspect, there is provided a display device including the display substrate as described above.

In one aspect, there is provided a method for manufacturing a transistor, including: forming a base structure; forming an active layer on the base structure; and forming a gate electrode, a source electrode and a drain electrode on a side of the active layer distal to the base structure. The active layer includes a first region corresponding to an orthographic projection of the gate electrode on the base structure and a second region outside the orthographic projection. The forming the base structure includes: forming the base structure such that a surface of the base structure in contact with the active layer in the first region is not in the same plane as a surface of the base structure in contact with the active layer in the second region. The forming the active layer on the base structure includes: forming the active layer such that the active layer in the first region has substantially the same thickness as a thickness of the active layer in the second region; and conductorizing the active layer in the second region.

In one embodiment, the forming the base structure includes: forming the base structure including one or more sub-film layers, wherein at least one sub-film layer of the one or more sub-film layers in the first region has a greater thickness than a thickness of the at least one sub-film layer in the second region.

In one embodiment, the forming the base structure including one or more sub-film layers includes: forming the base structure including a buffer layer, a light shielding layer and a substrate, forming the light shielding layer through a halftone mask process such that the light shielding layer in the first region has a greater thickness than a thickness of the light shielding layer in the second region.

In one embodiment, the forming the base structure including one or more sub-film layers includes: forming the base structure including a buffer layer, a light shielding layer and a substrate, and forming the buffer layer through a halftone mask process such that the buffer layer in the first region has a greater thickness than thickness of the buffer layer in the second region.

In one embodiment, the forming the base structure including one or more sub-film layers includes: forming the base structure including a buffer layer, a light shielding layer and a substrate, and forming the substrate through a halftone mask process such that the substrate in the first region has a greater thickness than a thickness of the substrate in the second region.

In one embodiment, the forming the active layer on the base structure further includes: depositing an oxide semiconductor film on the base structure; patterning the oxide semiconductor film through an exposure process, a development process and an etching process to form a pattern of the active layer; forming a pattern of a first insulating layer and a pattern the gate electrode on the pattern of the active layer in the first region; and conductorizing the pattern of the active layer in the second region by bombarding the pattern of the active layer in the second region using helium gas to form the active layer.

DETAILED DESCRIPTION

In order to ensure a better understanding on the technical solution of the present disclosure for those skilled in the art, a transistor and a manufacturing method thereof, display substrate and display device of the present disclosure will be described in detail below with reference to the accompanying drawings.

Figure 1:
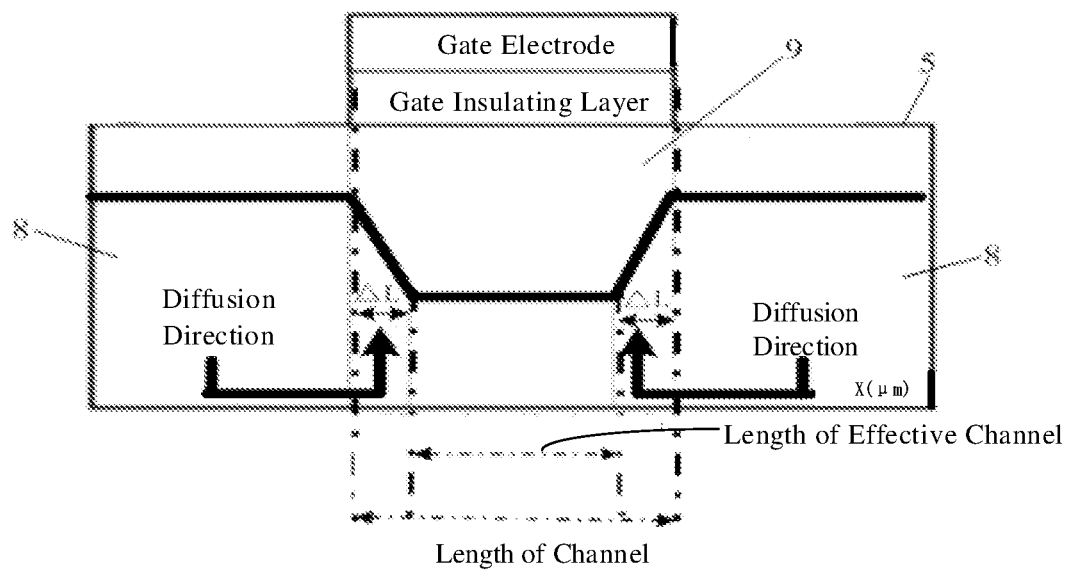
FIG. 1 is a schematic diagram showing a principle of shortening a length of an effective channel of a Top Gate oxide semiconductor transistor during a conductorizing process of an active layer.

Since a Top Gate oxide semiconductor transistors typically has a shorter channel, uniformity of a threshold voltage of the Top Gate oxide semiconductor transistors will be affected by the short channel effect. In particular, during the conductorizing process of an active layer including an oxide semiconductor material (e.g., IGZO) of a transistor, the conductorized regions on opposite sides of the active layer have certain influence on an intermediate non-conductorized region (i.e., an effective channel region). For example, during the conductorizing process, as shown in FIG. 1, the oxide semiconductor material in the conductorized regions 8 on opposite sides of the active layer 5 may diffuse into the intermediate non-conductorized region 9 (i.e., the effective channel region) such that an effective length of the intermediate non-conductorized region 9 in the transistor is shortened, thereby affecting uniformity of length of the effective channel (Effective Ch. length) of the transistor. An overall length (i.e., Ch. length) of the active layer 5 of the transistor is related to the length of the effective channel (i.e., a length of the effective channel region, represented by Effective Ch. Length) as follows: Ch. Length=Effective Ch. Length+2ΔL, wherein ΔL is a length of the conductorized regions 8 on opposite sides of the active layer 5 penetrating into the intermediate non-conductorized region 9 during the conductorizing process; the greater ΔL, the shorter the Effective Ch. length, resulting in poor uniformity of the threshold voltage of the transistor.

Figure 2:
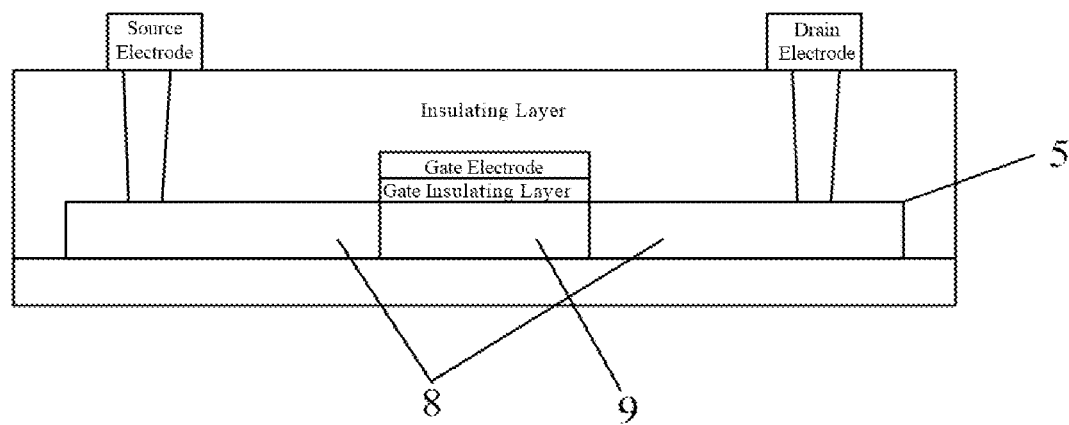
FIG. 2 is a cross-sectional diagram of a structure of a Top Gate oxide semiconductor transistor in the related art.

In order to ensure the Effective Ch. length of the transistor and thus further improve the uniformity of the threshold voltage of the transistor, it is desired to reduce the influence of the active layer 5 on the intermediate non-conductorized region 9 during the conductorizing process. The structure of a Top Gate oxide semiconductor transistor in the related art is shown in FIG. 2. Since the conductorized regions 8 on both sides of the active layer 5 and the intermediate non-conductorized region 9 are located on the same plane, diffusion of the material of the active layer into the intermediate non-conductorized region 9 happens on the same plane during the subsequent conductorizing process of the active layer 5, which has a significant influence on the intermediate non-conductorized region 9. Further, a transistor of such structure is very susceptible to the short channel effect.

Figure 3:
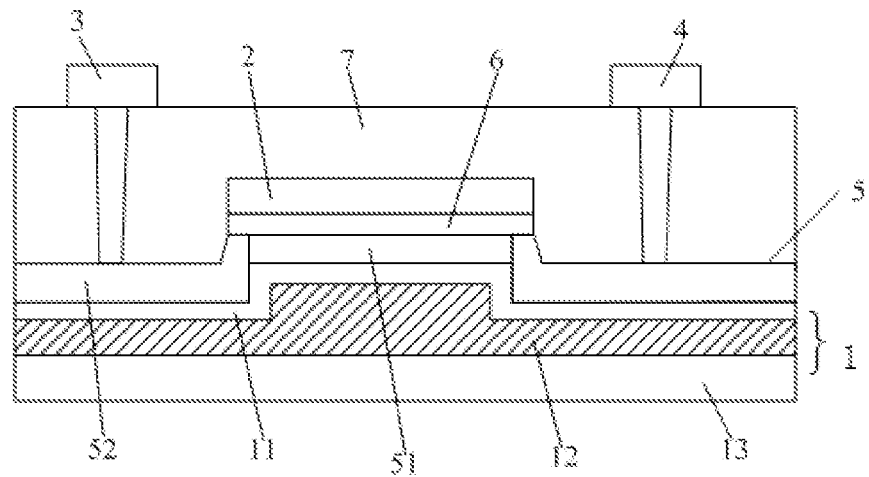
FIG. 3 is a cross-sectional diagram of a structure of a Top Gate oxide semiconductor transistor according to an embodiment of the present disclosure.

FIG. 3 is a structural cross-sectional diagram of a Top Gate oxide semiconductor transistor according to an embodiment of the present disclosure. As shown in FIG. 3, the transistor includes a base structure 1, and a gate electrode 2, a source electrode 3, a drain electrode 4 and an active layer 5 disposed on the base structure 1. The gate electrode 2, the source electrode 3 and the drain electrode 4 are all located on a side of the active layer 5 distal to the base structure 1. The active layer 5 includes: a first region 51 corresponding to an orthographic projection region of the gate electrode 2 on the base structure 1; and a second region 52 located outside the orthographic projection region. The second region 52 is provided with a conductorized semiconductor material, and a surface of the base structure 1 in contact with the first region 51 is not in the same plane as a surface of the base structure 1 in contact with the second region 52.

In one embodiment, a surface of the base structure 1 in contact with the first region 51 is not in the same plane as a surface of the base structure 1 in contact with the second region 52, and the active layer in the first region has substantially the same thickness as that of the active layer in the second region. Alternatively, a surface of the active layer 5 proximal to the base structure 1 in the first region 51 is higher than a surface of the active layer 5 proximal to the base structure 1 in the second region 52, and a surface of the active layer 5 distal to the base structure in the first region 51 is higher than a surface of the active layer 5 distal to the base structure in the second region 52. With such configuration, a height difference is formed between the first region 51 and the second region 52 of the active layer 5 (i.e., the first region 51 and the second region 52 are not on the same plane) such that during the conductorizing process of the second region 52, a path for the active layer material to diffuse from the second region 52 to the first region 51 is lengthened, and more energy is required for the diffusion of the active layer material, and such that during the conductorizing process of the second region 52, the active layer material hardly diffuse into the first region 51. Therefore, the length of the first region 51 is hardly shortened during the conductorizing process of the second region 52, the length of the effective channel of the transistor is hardly shortened during the conductorizing process, thereby finally greatly reducing the influence of the second region 52 on the first region 51 during the conductorizing process, improving the poor uniformity of the threshold voltage of the transistor due to the short channel effect, and avoiding the defects of the transistor.

In this embodiment, a surface of the base structure 1 distal to the active layer 5 is a flat surface. The base structure 1 includes a plurality of sub-film layers, wherein at least one sub-film layer of the plurality of sub-film layers has a greater thickness in the first region 51 than a thickness of the at least one sub-film layer in the second region 52.

In one embodiment, the base structure 1 includes three sub-film layers, i.e., a buffer layer 11, a light shielding layer 12, and a substrate 13, arranged sequentially between the active layer 5 and the base structure 1 along a direction distal to the active layer 5. The light shielding layer 12 in the first region 51 has a greater thickness than that of the light shielding layer 12 in the second region and/or, the buffer layer 11 in the first region 51 has a greater thickness than that of the buffer layer 11 in the second region 52; and/or, the substrate 13 in the first region 51 has a greater thickness than that of the substrate 13 in the second region 52. That is, the thickness of at least one of the three sub-film layers is not uniform. The at least one sub-film layer in the first region 51 has a greater thickness than that of the at least one sub-film layer in the second region 52 such that a height difference is formed between the first region 51 and the second region 52 of the active layer 5.

In one embodiment, the buffer layer 11 and the substrate 13 each have a uniform thickness in the first region 51 and the second region 52, while the light shielding layer 12 in the first region 51 has a greater thickness than that of the light shielding layer 12 in the second region 52. By setting the light shielding 12 in the first region 51 having a different thickness from that of the light shielding layer 12 in the second region 52, a height difference is formed between the active layer 5 in the first region 51 and the active layer 5 in the second region 52.

In this embodiment, the light shielding layer 12 is made of a light shielding metal material. With the arrangement of the light shielding layer 12, drifting of the threshold voltage of the transistor can be improved or prevented, thereby improving uniformity of the threshold voltage of the transistor.

In one embodiment, the light shielding layer 12 may be located only in the first region 51 and not in the second region 52 such that a height difference can also be formed between the active layer 5 in the first region 51 and the active layer 5 in the second region 52.

The substrate 13 is made of a glass material. A first insulating layer 6 is disposed between the gate electrode 2 and the active layer 5; the source electrode. 3 and the drain electrode 4 are located on a side of the gate electrode 2 distal to the active layer 5 and located in the same layer. A second insulating layer 7 is disposed between the source electrode 3, drain electrode 4 and the gate electrode 2. The active layer 5 is made of an oxide semiconductor material. The active layer 5 made of oxide semiconductor material needs to be conductorized during manufacture.

In another embodiment, in order to make the surface of the base structure 1 in contact with the active layer in the first region 51 not in the same plane as the surface of the base structure 1 in contact with the active layer in the second region 52, a recess may be provided at a position of the base structure 1 corresponding to the first region 51, for example, any one of the sub-film layers of the base structure 1 in the first region 51 has a smaller thickness than that of the sub-film layer in the second region 52 through a halftone mask process. In one embodiment, the light shielding layer 12 in the first region 51 has a smaller thickness than that of the light shielding layer 12 in the second region 52. In one embodiment, the buffer layer 11 in the first region 51 has a smaller thickness than that of the buffer layer 11 in the second region 52. In one embodiment, the substrate 13 in the first region 51 has a smaller thickness than that of the substrate 13 in the second region 52. In this way, it can also achieve that during the conductorizing process of the second region 52, a path for the active layer material to diffuse from the second region 52 to the first region 51 is lengthened, and more energy is required for the diffusion of the active layer material, thereby improving the poor uniformity of the threshold voltage of the transistor due to the short channel effect, and avoiding the defects of the transistor.

Based on the above structure of the transistor, the present embodiment further provides a method for manufacturing the transistor, including forming a base structure, a gate electrode, a source electrode, a drain electrode and an active layer, wherein the step of forming the active layer includes conductorizing the second region of the active layer, and the step of forming the base structure includes making a surface of the base structure in contact with the active layer in the first region not in the same plane as a surface of the base structure in contact with the active layer in the second region.

The step of forming the base structure includes: forming the light shielding layer in the first region and in the second region through a halftone mask process such that the light shielding layer in the first region has a different thickness from that of the light shielding layer in the second region; and/or, forming the buffer layer in the first region and in the second region through a halftone mask process such that the buffer layer in the first region has a different thickness from that of the buffer layer in the second region; and/or, forming the substrate in the first region and in the second region through a halftone mask process such that the substrate in the first region has a different thickness from that of the substrate in the second region.

In one embodiment, the step of forming the base structure includes: forming the light shielding layer in the first region and in the second region through a halftone mask process such that the light shielding layer in the first region has a different thickness from that of the light shielding layer in the second region.

The step of forming the active layer includes: depositing an oxide semiconductor film on the base structure; patterning the oxide semiconductor film through an exposure process, a development process and an etching process to form a pattern of the active layer; forming a pattern of a first insulating layer and a pattern of the gate electrode on the pattern of the active layer in the first region; and bombarding the pattern of the active layer in the second region using helium gas to conductorize the active layer in the second region, thereby forming the active layer.

FIGS. 4 to 12 are schematic diagrams showing a method for manufacturing a transistor according to an embodiment of the present disclosure. As shown in FIGS. 4 to 12, the method includes steps 101 to 108.

Figure 4:
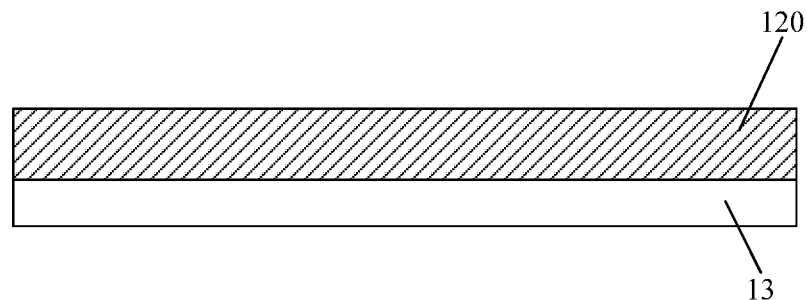
FIGS. 4 to 12 are schematic diagrams showing a method for manufacturing a transistor according to an embodiment of the present disclosure.
Figure 5:
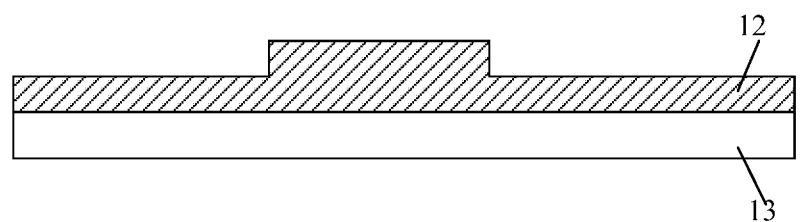

At step 101, a metal film 120 (e.g., including Mo, Al, etc.) is deposited on the substrate using a magnetron sputtering apparatus, as shown in FIG. 4; and then, the deposited metal film is patterned through a halftone mask process to form a light shielding layer 12, as shown in FIG. 5.

Figure 6:
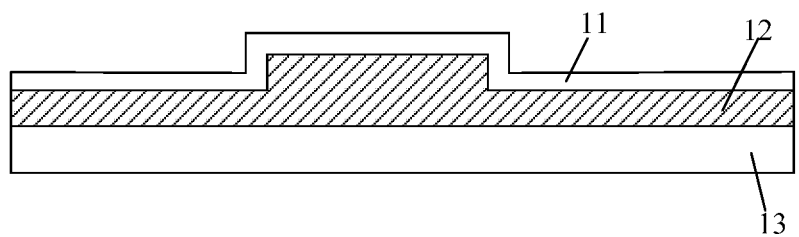

At step 102, a buffer layer 11 is formed by depositing an insulating film including silicon oxide, silicon nitride, etc.) by PECVD (plasma enhanced chemical vapor deposition), as shown in FIG. 6.

Figure 7:
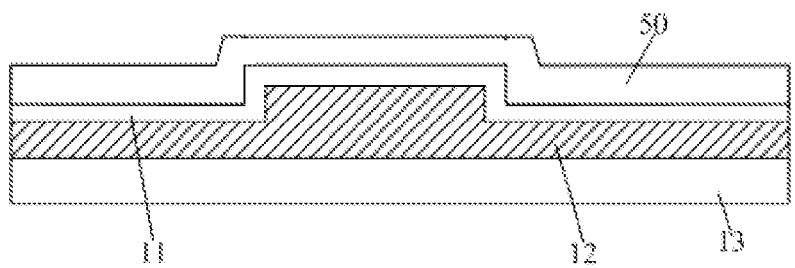

At step 103, an oxide semiconductor film 50 (e.g., including IGZO or ITZO) is deposited on the buffer layer 11, and then oxide semiconductor film 50 is patterned by an exposure process, a development process, and an etching process, as shown in FIG. 7.

Figure 8:
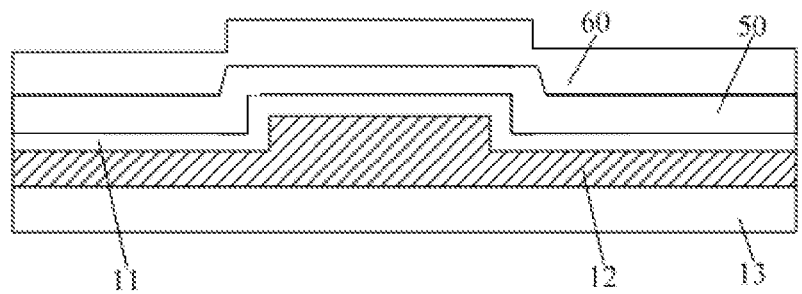

At step 104, an insulating film (e.g., including silicon oxide, silicon nitride, etc.) is deposited by PECVD on the oxide semiconductor film 50 as a first insulating layer film 60 (as shown in FIG. 8).

Figure 9:
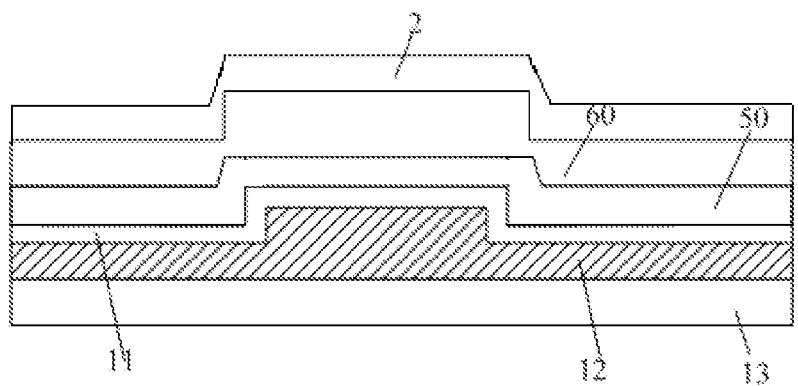
Figure 10:
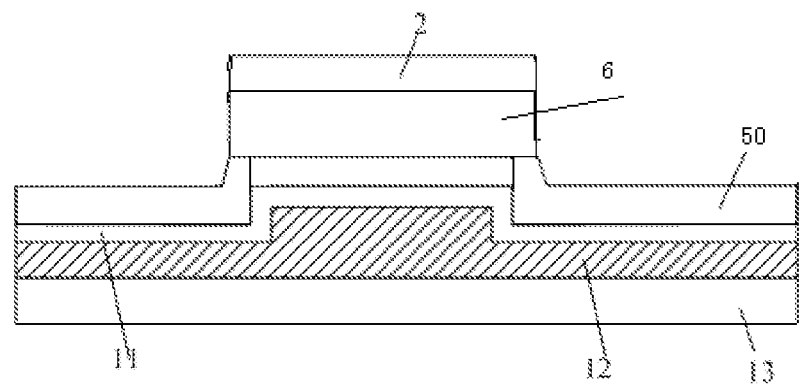

At step 105, a metal film (e.g., including Cu, Al, etc.) is deposited on the first insulating layer film 60 using a magnetron sputtering apparatus, and then the metal film is patterned to form the gate electrode 2 (as shown in FIGS. 9 and 10).

At step 106, the first insulating layer film 60 is patterned by dry etching to form a first insulating layer 6; and then, the oxide semiconductor film 50 is conductorized to form an active layer 5 (as shown in FIG. 10).

Figure 11:
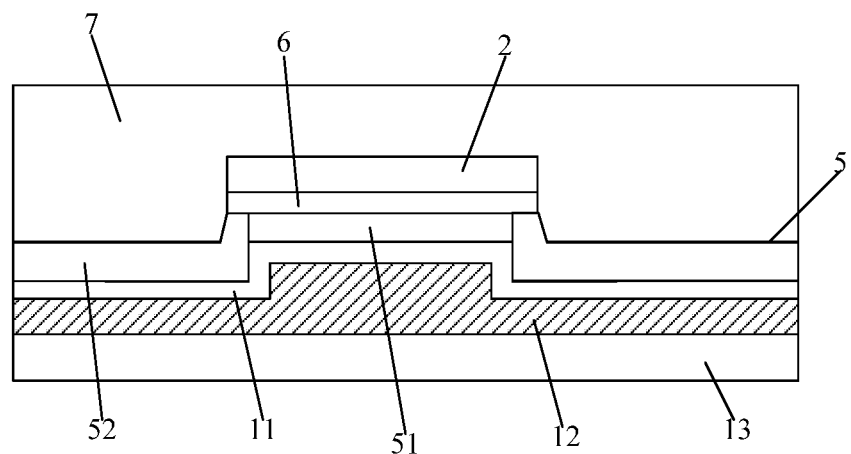

At step 107, an insulating film (e.g., including silicon oxide, silicon nitride, etc.) is deposited by PECVD and patterned to form a second insulating layer 7 (as shown in FIG. 11).

Figure 12:
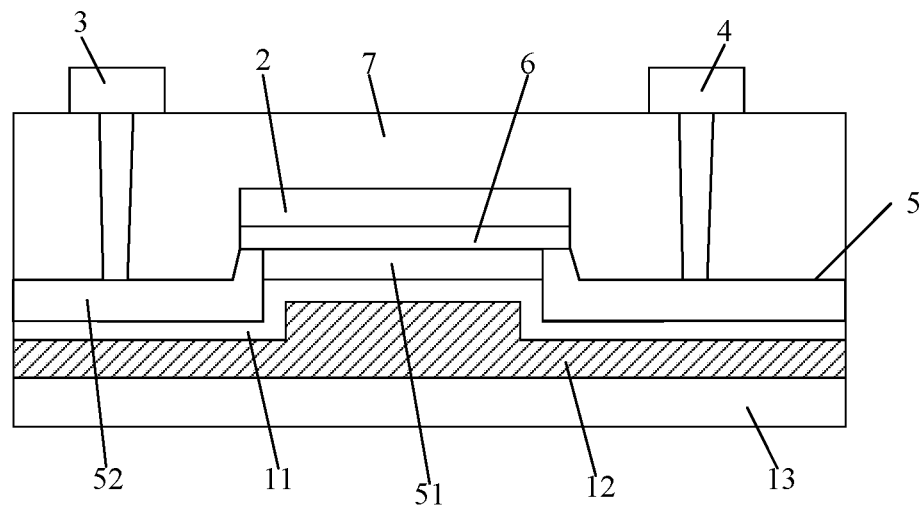

At step 108, a metal film (e.g., including Cu, Al, etc.) is deposited using a magnetron sputtering apparatus and patterned to form a source electrode 3 and a drain electrode 4 (as shown in FIG. 12).

In an embodiment of the present disclosure, there is further provided a transistor. Unlike the above embodiments, the base structure of the transistor includes only one sub-film layer, i.e., the substrate, and the substrate in the first region has a greater thickness than that of the substrate in the second region.

Other structures of the transistor in the present embodiment are the same as those in the above embodiments, and thus are omitted here.

Accordingly, in the method for manufacturing the transistor in the present embodiment, the step of forming the base structure includes: forming the substrate in the first region and in the second region through a halftone mask process such that the substrate in the first region has a different thickness from that of the substrate in the second region.

Other steps in the method for manufacturing the transistor in the present embodiment are the same as those in the above embodiments, and thus are omitted here.

Figure 13:
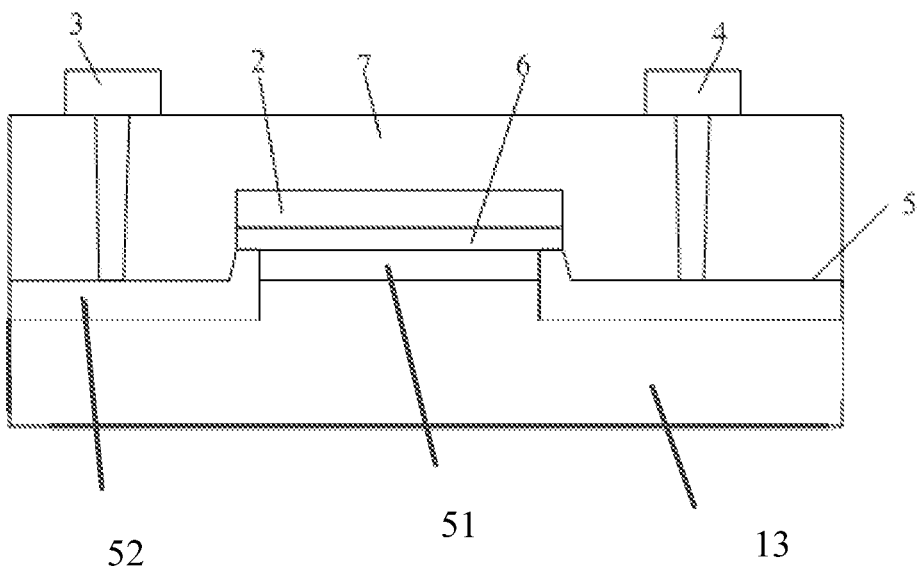
FIG. 13 is a cross-sectional diagram of a structure of a transistor according to an embodiment of the present disclosure.

In an embodiment of the present disclosure, there is further provided a transistor. Unlike the above embodiments, as shown in added FIG. 13, the base structure of the transistor includes only one sub-film layer, i.e., the substrate, and the substrate in the first region has a greater thickness than that of the substrate in the second region.

With such arrangement, a height difference can also be formed between the active layer in the first region and the active layer in the second region.

Other structures of the transistor as well as the manufacturing method thereof in this embodiment are the same as those in the first embodiment, and thus are not repeated here.

In the transistor of the present disclosure, since a surface of the base structure in contact with the active layer in the first region not in the same plane as a surface of the base structure in contact with the active layer in the second region, a height difference is formed between the active layer in the first region and the active layer in the second region, such that during the conductorizing process of the second region, a path for the active layer material to diffuse from the second region to the first region is lengthened, and more energy is required for the diffusion of the active layer material, and such that during the conductorizing process of the second region, the active layer material hardly diffuse into the first region and thus the length of the first region is hardly shortened during the conductorizing process of the second region. That is, the effective channel length of the transistor is hardly shortened during the conductorizing process, thereby finally greatly reducing the influence of the second region on the first region during the conductorizing process of the second region, improving the poor uniformity of the threshold voltage of the transistor due to the short channel effect, and avoiding the defects of the transistor.

The present disclosure further provides a display substrate including the transistor according to any one of the embodiments as described above.

By adopting the transistor according to any one of the embodiments, the display quality of the display substrate is improved.

The present disclosure further provides a display device including the display substrate as described above.

By adopting the display substrate s described above, the display quality of the display device is improved.

The display device according to the present disclosure may be any product or component having a display function, such as an LCD panel, an LCD television, an OLED panel, an OLED television, a displayer, a mobile phone, a navigator or the like, or a semi-finished product of the product or component having a display function.

It should be understood that the above embodiments are merely exemplary embodiments for the purpose of illustrating the principle of the disclosure. However, the present disclosure is not limited thereto. It will be apparent to those skilled in the art that various changes and modifications can be made without departing from the spirit and essence of the present disclosure, and the changes and modifications should be regarded as falling within the scope of the present disclosure.

What is claimed is:

1. A top gate metal oxide transistor, comprising:
a base substrate;
a light shielding layer on the base substrate, wherein an upper surface of the light shielding layer has a non-protruding region and a protruding region protruding from the non-protruding region;
a first insulation layer with an uniform thickness on the light shielding layer;
an active layer on the first insulation layer and covering both of the non-protruding region and the protruding region of the light shielding layer;
a gate insulating layer on the active layer; and
a gate electrode on the gate insulating layer,
wherein the active layer comprises a channel portion, and a first conductorized portion and a second conductorized portion on both sides of the channel portion, and the first conductorized portion and the second conductorized portion are formed by performing a conductorization process on an oxide semiconductor material of the active layer,
both of the first conductorized portion and the second conductorized portion are in the non-protruding region of the light shielding layer, the channel portion is in the protruding region of the light shielding layer, and lower surfaces of the first conductorized portion and the second conductorized portion are lower than a lower surface of the channel portion.

2. The top gate metal oxide transistor according to claim 1, wherein the light shielding layer comprises a light shielding metal material.

3. The top gate metal oxide transistor according to claim 1, further comprising:
a second insulating layer between a source electrode, a drain electrode and the gate electrode; wherein
the source electrode and the drain electrode are adjacent to the gate electrode distal to the active layer, and
the source electrode and the drain electrode are in a same layer.

4. A display substrate comprising a transistor, wherein the transistor is according to claim 1.

5. A display device comprising a display substrate, wherein the display substrate is according to claim 4.

6. A method for manufacturing a top gate metal oxide transistor, comprising:
providing a base substrate;
forming a light shielding layer on the base substrate, wherein an upper surface of the light shielding layer has a non-protruding region and a protruding region protruding from the non-protruding region;
forming a first insulating layer with an uniform thickness on the light shielding layer;
forming an active layer on the first insulating laser to cover both of the non-protruding region and the protruding region of the tight shielding layer;
forming a gate insulating layer on the active layer; and
forming a gate electrode on the gate insulating laser,
wherein forming the active layer on the first insulating laser comprises:
performing a conductorization process on an oxide semiconductor material of the active layer, such that a channel portion of the active layer is formed in the protruding region of the light shielding layer and both of a first conductorized portion and a second conductorized portion are formed in the non-protruding region of the light shielding layer, and lower surfaces of the first conductorized portion and the second conductorized portion are lower than a lower surface of the channel portion.

7. The method according to claim 6, wherein the forming the active layer further comprises:
depositing the oxide semiconductor material on the the first insulating layer;
patterning the oxide semiconductor material through an exposure process, a development process and an etching process to form a pattern of the active layer;
forming a pattern of the gate insulating layer and a pattern of the gate electrode on the pattern of the active layer in the protruding region; and
conductorizing the pattern of the active layer in the non-protruding region by bombarding the pattern of the active layer in the non-protruding region using helium gas to form the active layer.

* * * * *